United States Patent
Kim et al.

(10) Patent No.: US 7,200,053 B2
(45) Date of Patent: Apr. 3, 2007

(54) LEVEL SHIFTER FOR LOW VOLTAGE OPERATION

(75) Inventors: Tae H. Kim, Boise, ID (US); Michael V. Cordoba, Boise, ID (US); Howard C. Kirsch, Eagle, ID (US)

(73) Assignee: Micron Technology, Inc., Boise, ID (US)

( * ) Notice: Subject to any disclaimer, the term of this patent is extended or adjusted under 35 U.S.C. 154(b) by 211 days.

(21) Appl. No.: 10/931,587

(22) Filed: Sep. 1, 2004

(65) Prior Publication Data

US 2006/0044888 A1 Mar. 2, 2006

(51) Int. Cl.
*G11C 7/00* (2006.01)

(52) U.S. Cl. .................. 365/189.11; 365/203
(58) Field of Classification Search ........... 365/189.11, 365/203
See application file for complete search history.

(56) References Cited

U.S. PATENT DOCUMENTS

| | | | |
|---|---|---|---|
| 5,912,564 A * | 6/1999 | Kai et al. .................. 326/68 |
| 6,060,904 A | 5/2000 | Shimoda | |
| 6,087,880 A | 7/2000 | Takagi | |
| 6,160,723 A * | 12/2000 | Liu .............................. 363/60 |
| 6,501,306 B1 | 12/2002 | Kim et al. | |
| 6,642,769 B1 | 11/2003 | Chang | |
| 6,664,809 B1 | 12/2003 | Chiu | |
| 6,677,798 B2 * | 1/2004 | Chang et al. ............... 327/333 |
| 6,700,407 B1 | 3/2004 | Wert | |
| 6,838,924 B1 | 1/2005 | Davies, Jr. | |
| 6,980,194 B2 * | 12/2005 | Tobita ......................... 345/100 |
| 2004/0041614 A1* | 3/2004 | Tobita ......................... 327/333 |

* cited by examiner

*Primary Examiner*—Hoai V. Ho
(74) *Attorney, Agent, or Firm*—Leffert, Jay & Polglaze P.A.

(57) ABSTRACT

A voltage level translator boosts the gate voltage of a transistor, and increases the gate to source voltage, to allow operation over a wider range of supply voltages. The P/N ratio of transistors in the voltage level translator is therefore increased, and control of the flipping of nodes is dependent on gate voltages as opposed to P/N ratios.

41 Claims, 7 Drawing Sheets

LEVEL SHIFTER FOR LOW VOLTAGE OPERATION

FIELD

The present invention relates generally to integrated circuits and in particular the present invention relates to level shifting for low voltage operation of integrated circuits.

BACKGROUND

Normal operation of integrated circuits requires less and less operating voltage as technology continues to improve. As operating voltages for integrated circuits continue to shrink, voltage differences previously relied upon to be available for operating integrated circuits are becoming strained. Where once an operating supply voltage Vcc was on the order of 5 volts, supply voltages have dropped into the range of 1.2 volts. Supply voltages at this level are close to the threshold voltages of the devices that are being operated in a circuit.

When systems with low supply voltages are operated, current capabilities of devices are sometimes reduced due to the lack of sufficient voltage to fully turn on or turn off transistors and the like. When this happens, unreliable operation of the devices, and therefore the circuits, can create numerous issues, including failure of the part to perform as desired and the like. In memory devices, such an improper operation can result in lost data or incorrectly written data.

In order to provide sufficient operating voltages when supply voltages continue to drop, level shifters are used. Typical level shifter circuitry operates on a fairly narrow range of supply voltages. A previous level shifter 100 is shown in FIG. 1. Level shifter 100 comprises cross coupled p-channel metal oxide semiconductor (PMOS) transistors 102 and 104, and NMOS transistors 106 and 108 gate coupled to complementary inputs. Output is taken at node 110 and complementary output node 112.

For the reasons stated above, and for other reasons stated below which will become apparent to those skilled in the art upon reading and understanding the present specification, there is a need in the art for improved low level voltage shifting.

SUMMARY

The above-mentioned problems with level shifters and other problems are addressed by the present invention and will be understood by reading and studying the following specification.

In one embodiment, a voltage level translator includes a pair of cross coupled p-type transistors, a pair of n-type transistors connected between complementary inputs and a gate of the one of the p-type transistors, and a pair of boosting circuits. The gate of each of the n-type transistors is connected to one of the boosting circuits to boost the gate voltage of the n-type transistor.

In another embodiment, a voltage level translator including a first and a second p-type transistor, a first and a second n-type transistor, the first n-type transistor connected between an input signal and a gate of the second p-type transistor, and the second n-type transistor connected between an input signal and the gate of the first p-type transistor, and a pair of boosting circuits, the gate of one of the n-type transistors connected to one of the boosting circuits to boost the gate voltage of the n-type transistor.

In yet another embodiment, a memory device includes an array of memory cells, control circuitry to read, write and erase the memory cells, address circuitry to latch address signals provided on address input connections, input/output circuitry coupled to read and latch a row of data from the memory array, and a voltage level translator circuit connected to at least one of the control circuitry, the address circuitry, or the input/output circuitry. The voltage level translator includes a pair of cross coupled p-type transistors, a pair of n-type transistors connected between complementary inputs and a gate of the one of the p-type transistors, and a pair of boosting circuits, the gate of the n-type transistors connected to one of the boosting circuits to boost the gate voltage of the n-type transistor.

In still another embodiment, a processing system includes a processor and a memory coupled to the processor to store data provided by the processor and to provide data to the processor. The memory includes an array of memory cells, control circuitry to read, write and erase the memory cells, address circuitry to latch address signals provided on address input connections, input/output circuitry coupled to read and latch a row of data from the memory array, and a voltage level translator circuit connected to at least one of the control circuitry, the address circuitry, or the input/output circuitry. The voltage level translator includes a pair of cross coupled p-type transistors, a pair of n-type transistors connected between complementary inputs and a gate of the one of the p-type transistors, and a pair of boosting circuits, the gate of the n-type transistors connected to one of the boosting circuits to boost the gate voltage of the n-type transistor.

In still another embodiment, a method of boosting gate to source voltage of an n-type transistor in a voltage level translator includes boosting a gate to source voltage of each of a pair of pull down n-type transistors in the translator.

In yet another embodiment, a method of increasing an operating range of supply voltage in a voltage level translator includes boosting a gate to source voltage of each of a pair of pull down n-type transistors in the translator, and precharging the gate of each of the pair of n-type transistors.

Other embodiments are described and claimed.

DETAILED DESCRIPTION

Figure 1:
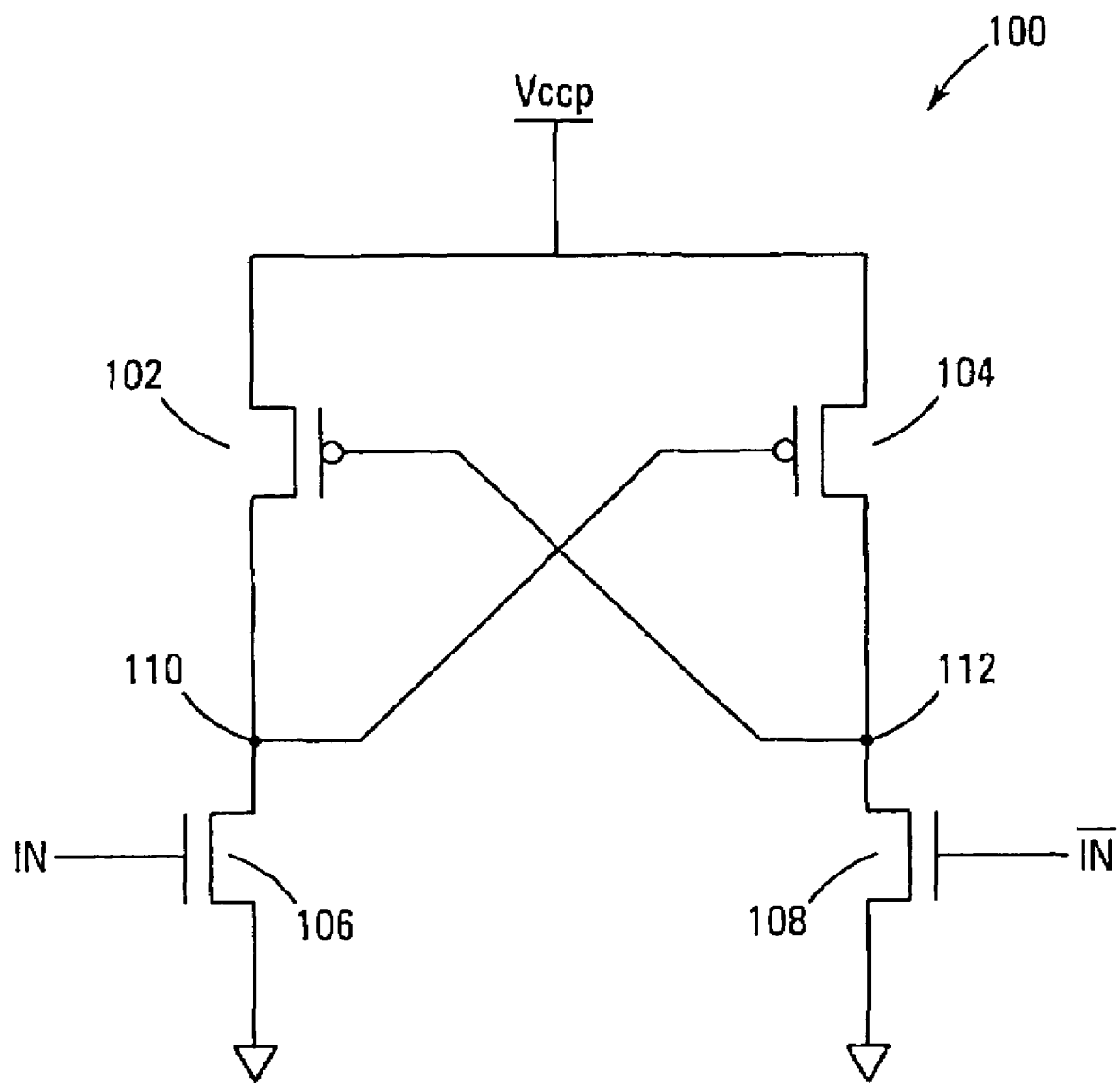
FIG. 1 is circuit diagram of a typical prior art level shifter.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The following detailed description is, therefore, not to be taken in a limiting sense, and the scope of the present invention is defined only by the appended claims, along with the full scope of equivalents to which such claims are entitled.

Figure 2:
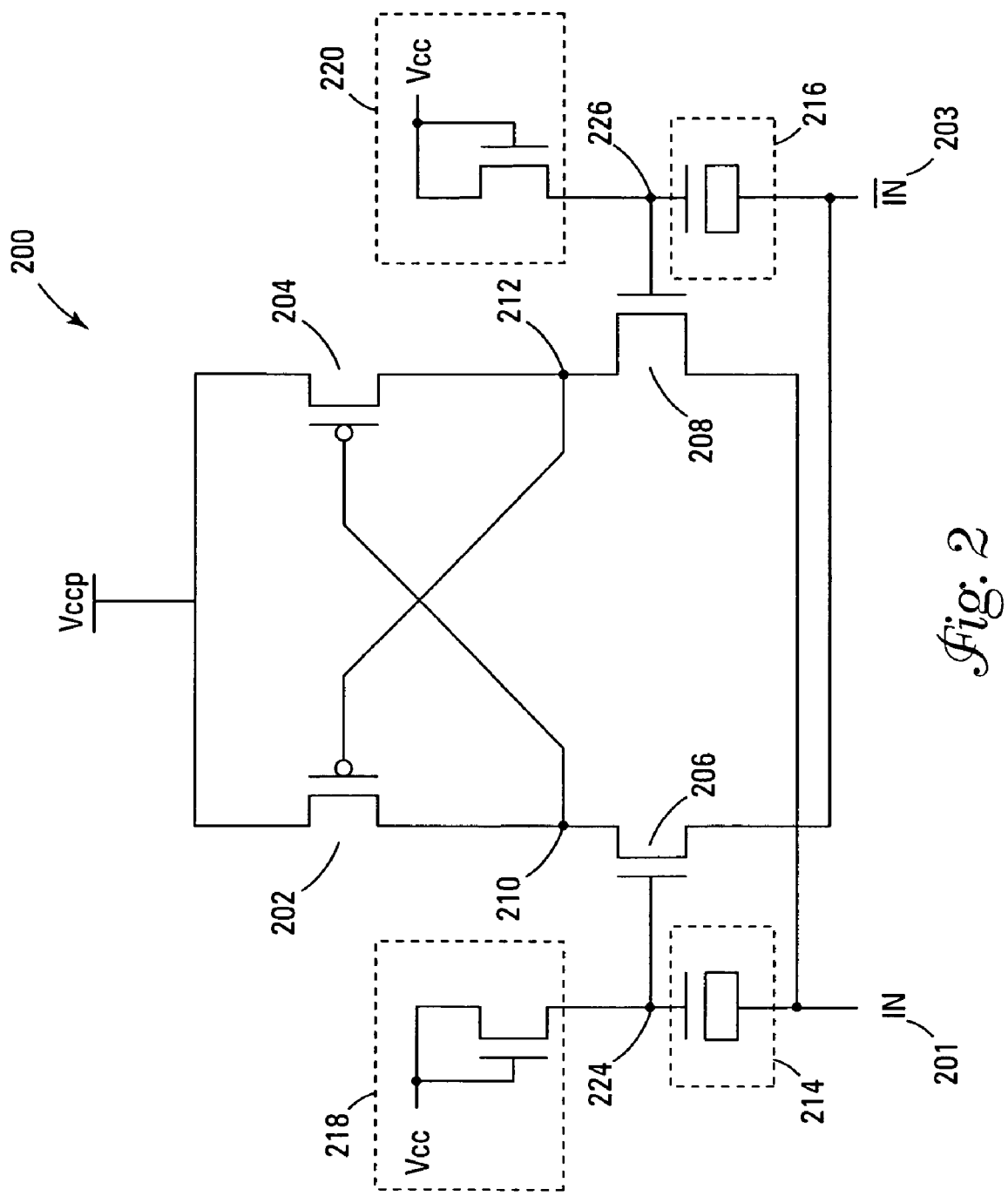
FIG. 2 is a circuit diagram of a level shifter according to one embodiment of the present invention.

FIG. 2 is a diagram of a voltage translator 200 according to one embodiment of the present invention. Voltage translator 200 comprises a pair of cross coupled PMOS transistors 202 and 204 in first and second branches, as well as NMOS transistors 206 and 208 connected in series with transistors 202 and 204, respectively, between Vccp and input bar signal 203 and input signal 201, respectively. The gates of transistors 202 and 204 are cross-coupled to nodes 212 and 210 of the other series branch, respectively. Boosting capacitance element 214 is connected between input 201 and precharge element 218, with a node 224 between boosting capacitance 214 and precharge element 218 connected to the gate of transistor 206. Boosting capacitance 216 is connected between input bar 203 and precharge element 220, with a node 226 between boosting capacitance 216 and precharge element 220 connected the gate of transistor 208.

In one embodiment, Vccp is approximately 3 volts, and Vcc is approximately 1.2 volts. Input signal 201 ramps from 0 to 1.2 V, and input bar 203 ramps from 1.2 to 0 V in an oscillating input. At those voltage ranges, the voltage at nodes 224 and 226 are at potential Vcc−Vt of the respective transistors of precharge elements 218 and 220. When input 201 equals 0, transistor 208 has a gate voltage sufficient to turn it completely on with the capacitance from boosting capacitance element 216. In that instance, node 212 is pulled to the value of input signal 201 (0 at this time), and transistor 202 turns on. This passes Vccp to node 210, turning transistor 204 completely off. As the input signal 201 ramps to 1.2 V, the current at transistor 208 slows, and transistor 206 begins to turn on. As this happens, the lowering voltage of complementary input signal 203 is passed to node 210, ramping the voltage down at node 210 to 0, turning transistor 204 on, which in turn passes Vccp to node 212, completely shutting off transistor 202. Because of the boosting at nodes 224 and 226, the normal gate to source voltage of transistors 206 and 208, which is typically 1.2 V, is increased to 1.2+ΔV, increasing the operating range of Vccp.

As the boosting capacitance of a boosting element drops, the transistor to which the boosting capacitance is connected is clamping. The very low current under initial conditions through transistor 206 because of the almost insufficient voltage at its gate means that node 210 cannot flip at such a condition. In a typical level translator such as that shown in FIG. 1, the P/N ratio of the transistors must be approximately 1:50 in order to provide proper operation, that is the n-type transistors are on the order of 50 time larger than the p-type transistors. The boosting capacitance and precharging of the present embodiments allows the size differences between the p-type and n-type transistors to drop, or in other words, the P/N ratio of the transistors is increased, to on the order of 1:3 or 1:4. Because of this, as supply voltages continue to drop, the boosted gate to source voltage at the transistors 206 and 208 allow for operation well beyond the normal operating range of typical level translators such as that shown in FIG. 1. Node flips in this embodiment do not rely heavily on P/N ratio. Instead, node flips in this embodiment are dependent on gate voltages. For a supply voltage Vcc of 1.5 V, a typical level translator, such as that shown in FIG. 1, and the embodiment of FIG. 2 operate properly (provided the P/N ratio is sufficiently low in the typical level translator). However, if Vcc drops to 1.2 volts, the typical configuration will not work, but the present embodiment does.

Figure 3:
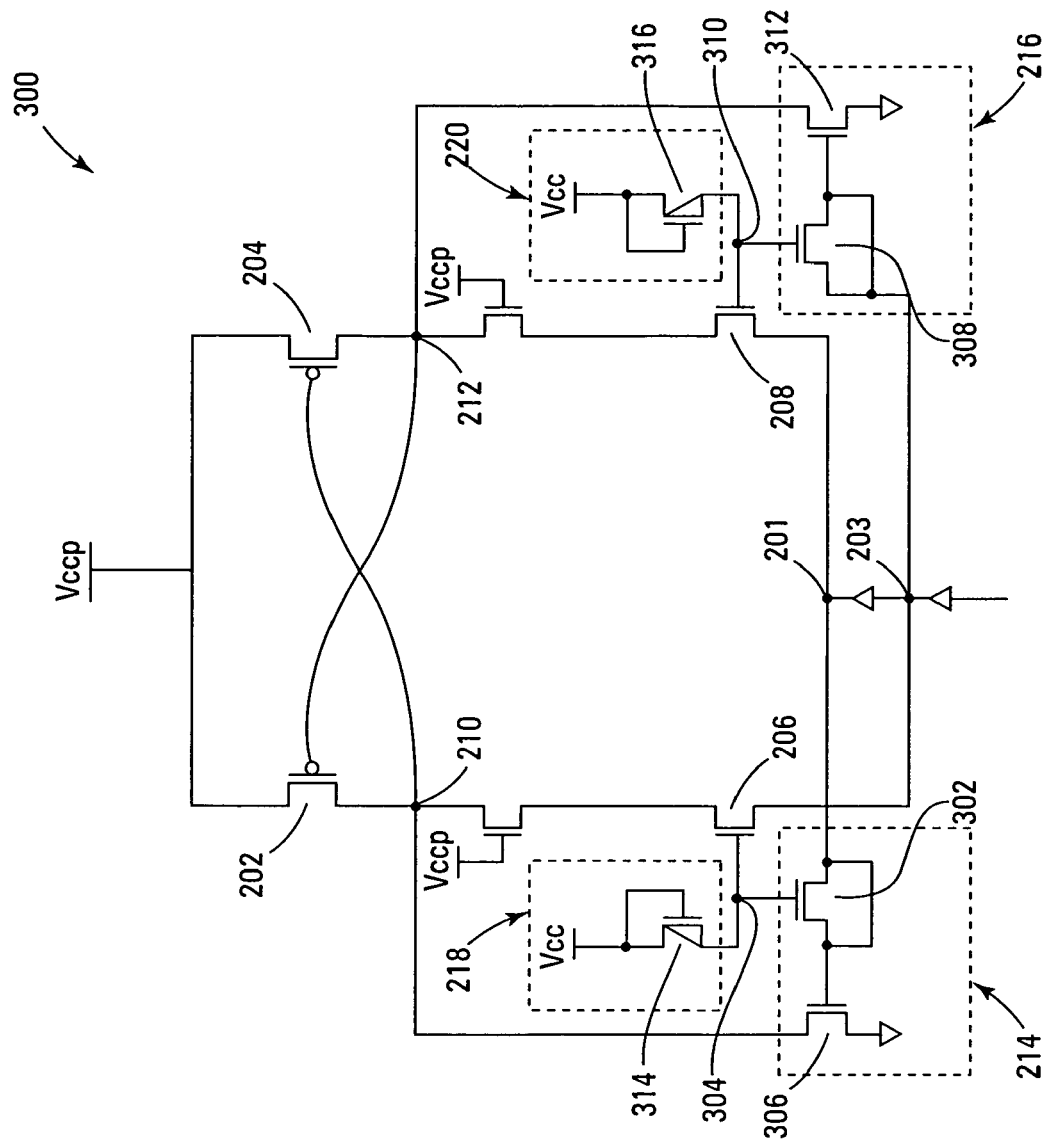
FIG. 3 is a circuit diagram of a level shifter according to another embodiment of the present invention.

More detailed circuits showing further embodiments of the present invention are shown in FIGS. 3, 4, 5, and 6. FIG. 3 is a diagram of a circuit 300. In circuit 300, the boosting elements 214 and 216, as well as the precharging elements 218 and 220, are shown in further detail. In FIG. 3, the element 214 comprises a transistor 302 with its drain and source connections electrically connected and its gate connected to node 304, and a transistor 306 gate connected to the source of transistor 302. Transistor 306 is connected between node 210 and ground. The element 216 comprises a similar drain to source connected transistor 308 with it's gate connected to node 310, and a transistor 312 gate connected to the source of transistor 308. Transistor 312 is connected between node 212 and ground.

Element 218 in one embodiment comprises a thin oxide low threshold voltage diode connected transistor 314 connected between Vcc and node 304. Element 220 in one embodiment comprises a thin oxide low threshold voltage diode connected transistor 322 connected between Vcc and node 310. Thin oxide devices have a lower threshold voltage Vt than thick oxide devices. In the embodiment of FIG. 3, the thin oxide devices are boosted with the boosting capacitance. Initial conditions for operation are therefore around 0.8 to 1.2 volts.

The boosting capacitance allows the sizes of the p-type and n-type transistors to be closer than previous level shifters, that is, the ratio of PMOS transistors 202 and 204 to NMOS transistors 206 and 208, respectively, is lowered. Typical P/N ratios to operate at low Vcc in the prior art are on the order of 1:50. In contrast, the ratios of the present invention are reduced because of the boosting to on the order of 1:3 or 1:4.

Figure 4:
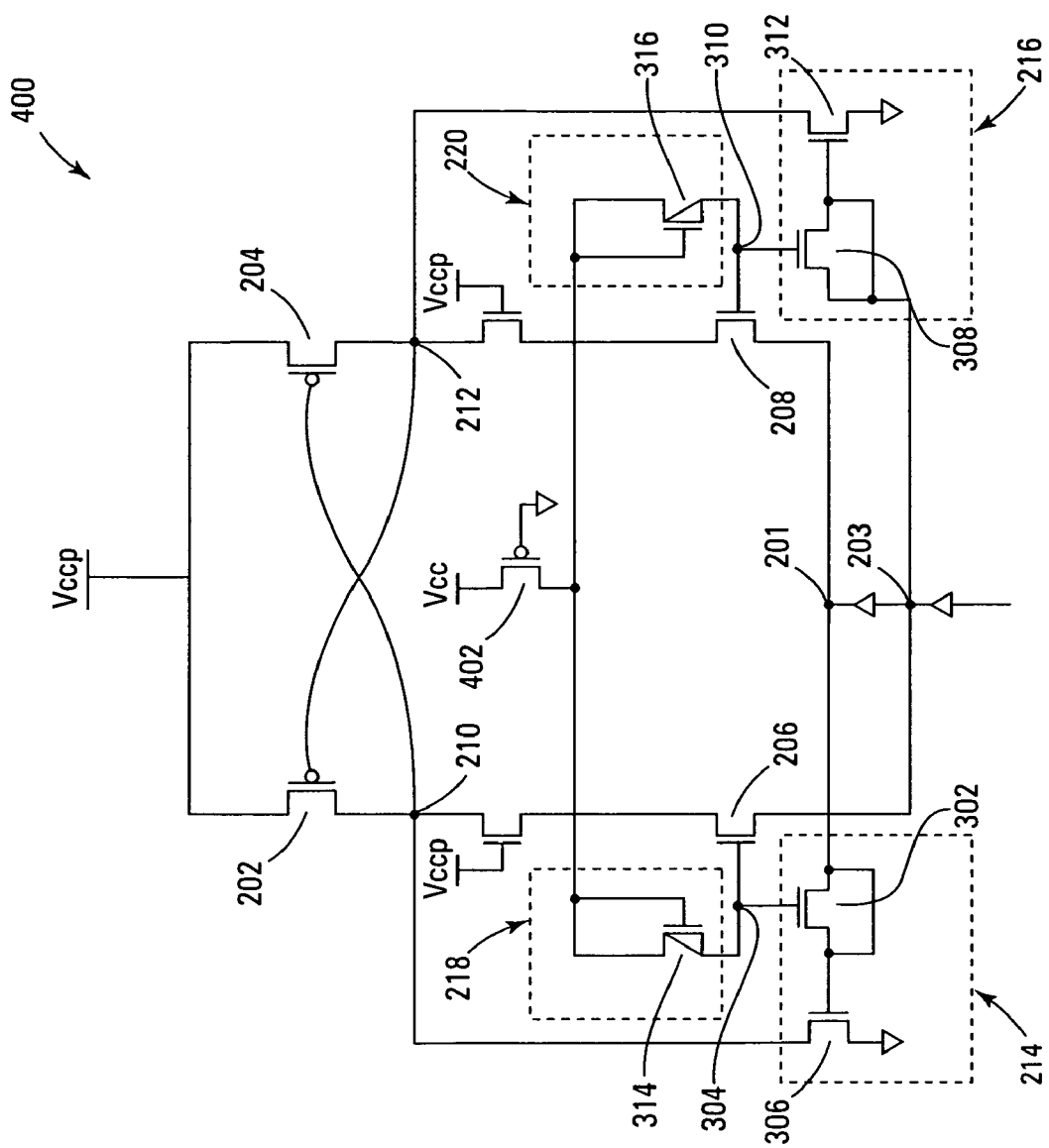
FIG. 4 is a circuit diagram of a level shifter according to still another embodiment of the present invention.

FIG. 4 shows another embodiment 400 of a level translator circuit. Circuit 400 is substantially identical to the circuit 300 of FIG. 3, with the exception of the connection of the transistors 314 and 316 to Vcc. The connection to Vcc for transistors 314 and 316 in circuit 300 is through p-type transistor 402 which is electrically connected to pass Vcc through to the transistors 314 and 316 because of its gate connection to ground. On power up of this circuit embodiment, the supply voltage Vcc is provided to the gates of the diode connected precharge transistors, and blocks early latching.

Figure 5:
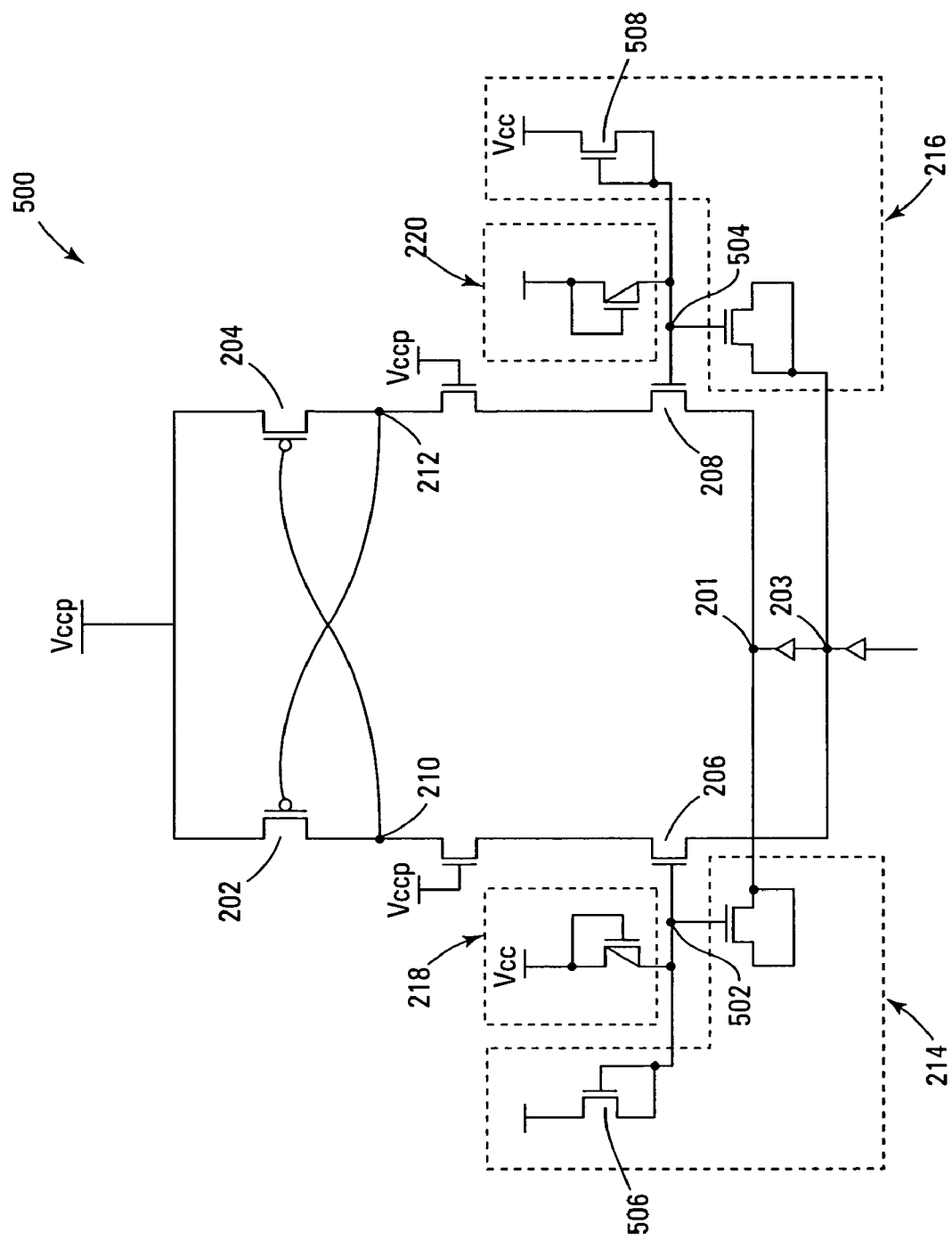
FIG. 5 is a circuit diagram of a level shifter according to yet another embodiment of the present invention.

FIG. 5 shows yet another embodiment 500 of a level translator circuit. Circuit 500 is substantially similar to circuit 300 of FIG. 3 with the exception of the configuration of the capacitive boosting elements 214 and 216. The boosting capacitance elements 214 and 216 each comprise in this embodiment a drain to source connected transistor 502 or 504 that is gate connected to node 304 or 310 respectively. Node 304 and node 310 are connected respectively to diode connected transistors 506 and 508 which are in turn connected to Vcc. This limits the voltage at the nodes 502 and 504 to approximately Vcc+Vt.

The embodiments of FIG. 5 use clamping circuits to limit the voltages at the nodes between the boosting capacitance and the precharge elements.

Figure 6:
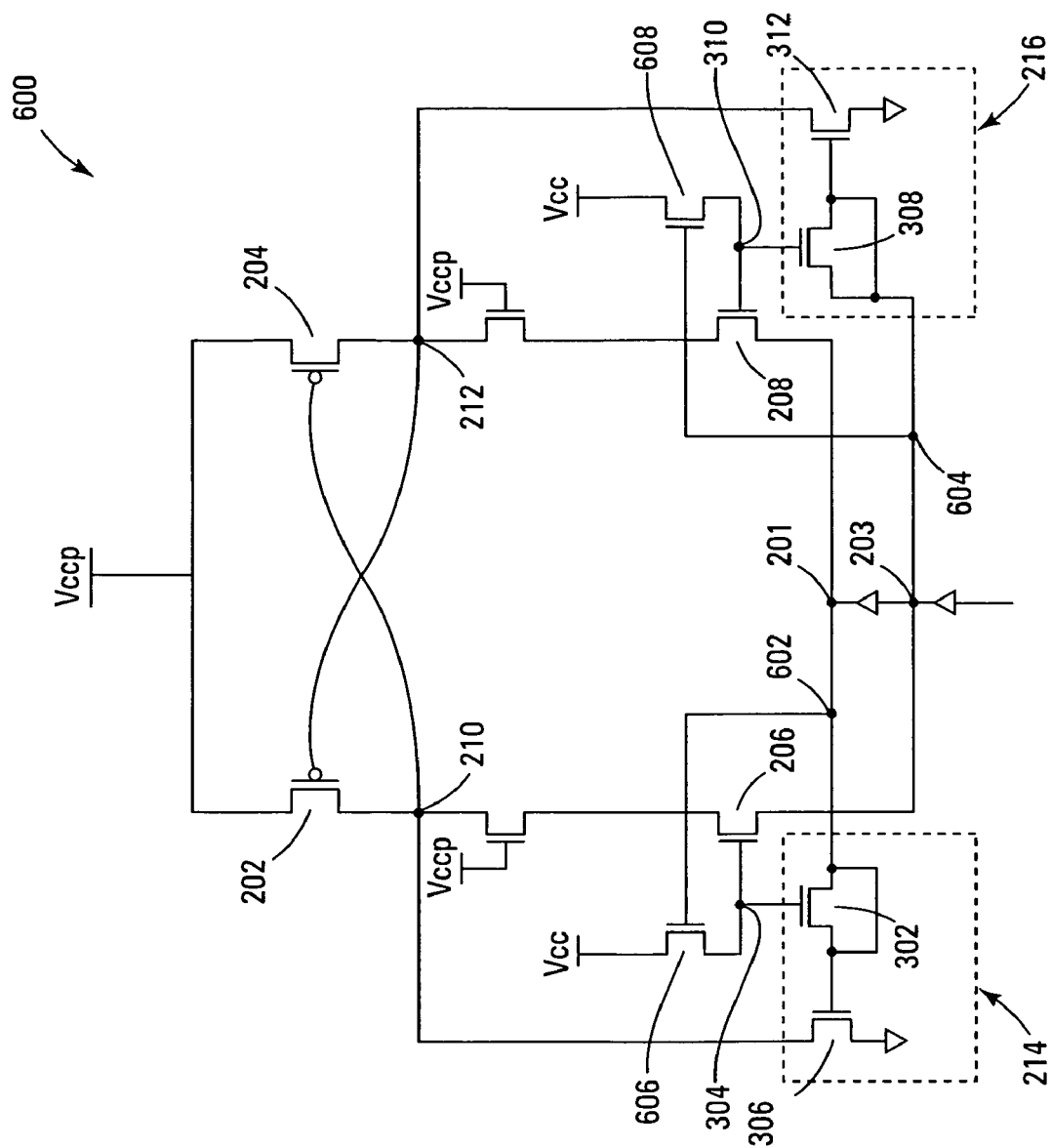
FIG. 6 is a circuit diagram of a level shifter according to yet another embodiment of the present invention.

FIG. 6 shows yet another embodiment 600 of a level translator circuit. Circuit 600 has boosting capacitance elements 214 and 216 substantially identical to that of FIG. 3.

Circuit 600 has nodes 602 and 604 connected, respectively, to the gates of precharge element transistors 606 and 608.

The embodiments of the present invention have wider acceptable Vcc ranges because of the boosting capacitance and precharging applied to the inputs.

Figure 7:
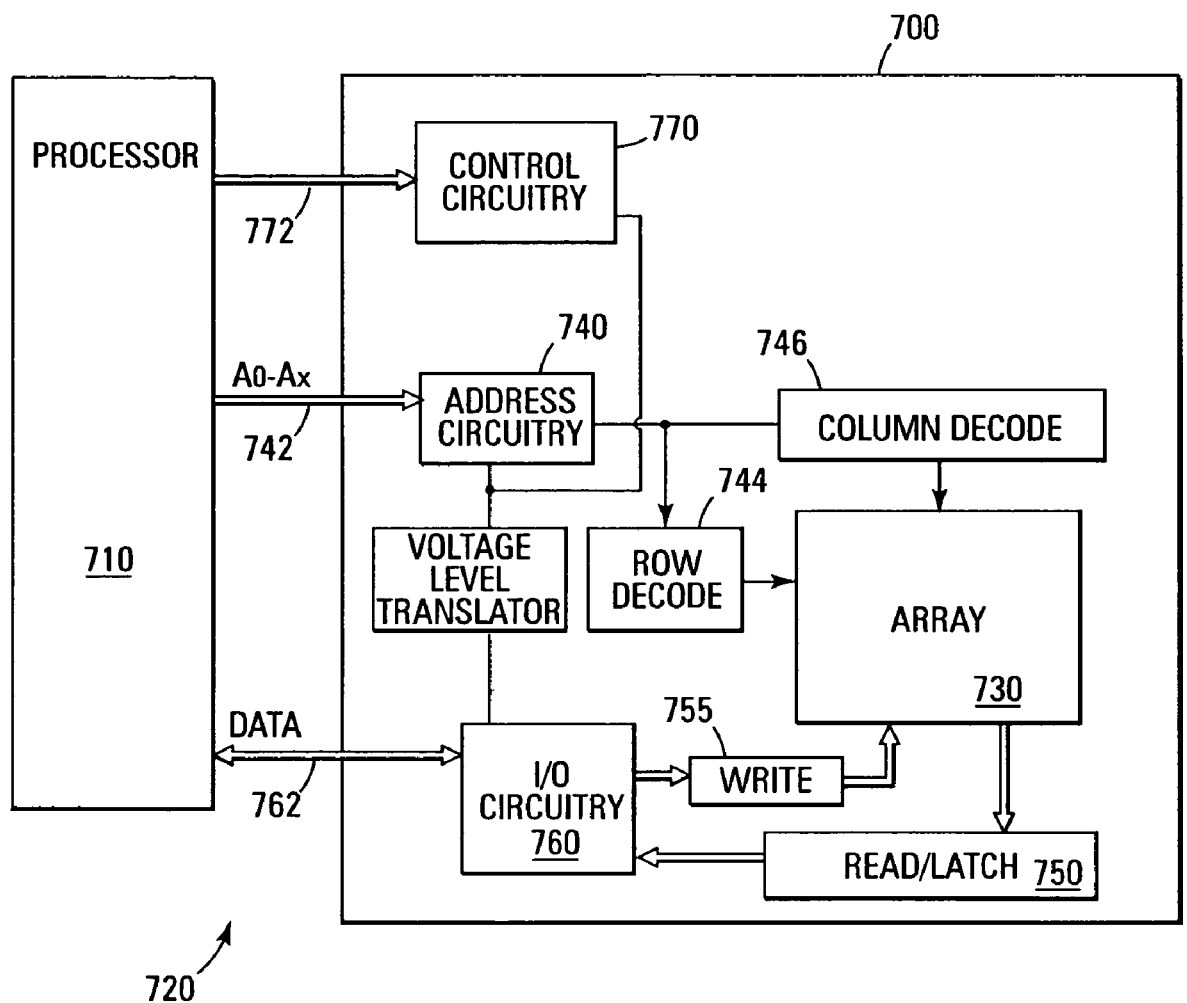
FIG. 7 is a block diagram of a memory and processing system on which embodiments of the present invention are practiced.
Figure 5:
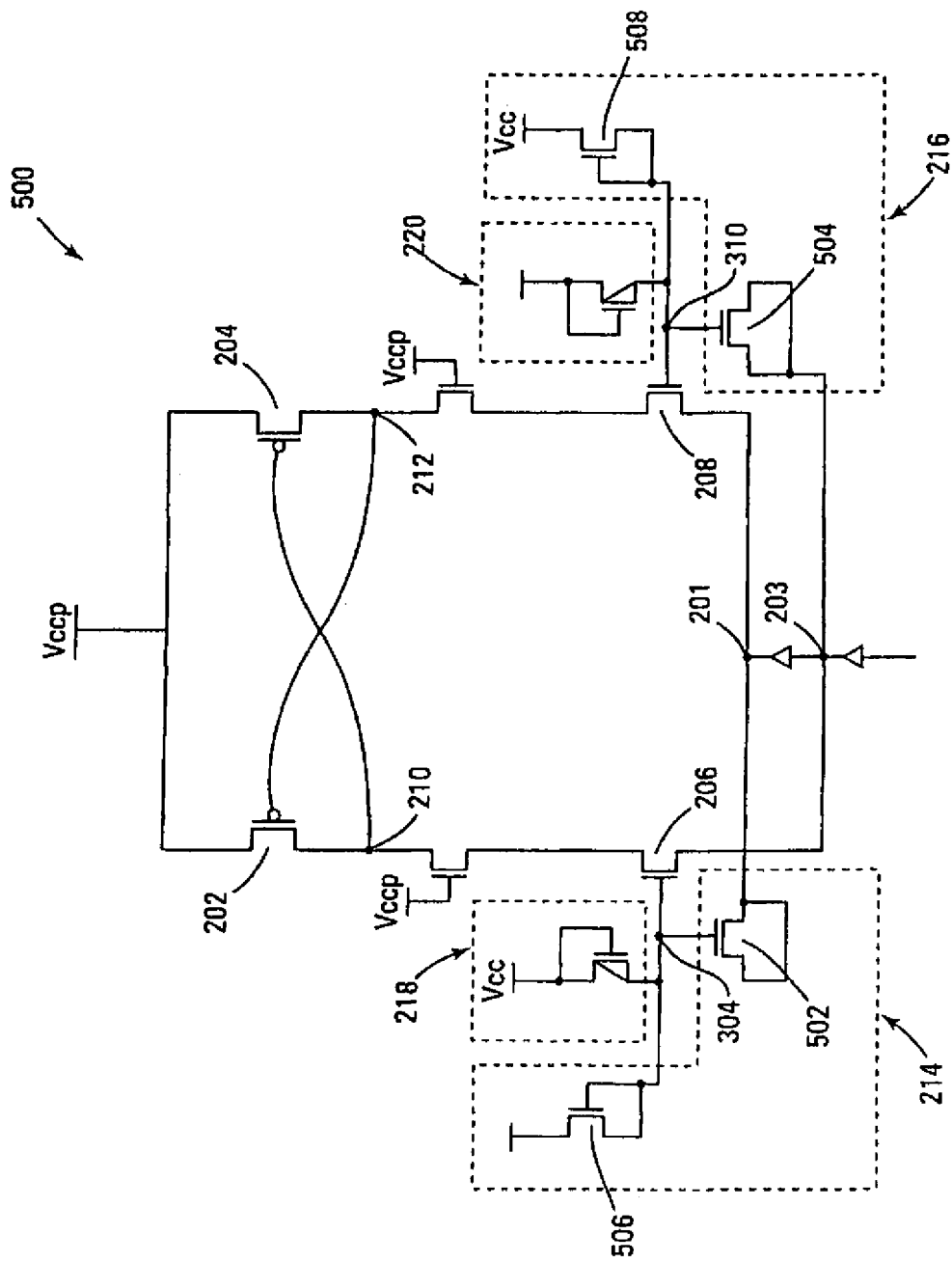

FIG. 7 is a functional block diagram of a memory device 700, of one embodiment of the present invention, which is coupled to a processor 710. The memory device 700 and the processor 710 may form part of an electronic system 720. The memory device 700 has been simplified to focus on features of the memory that are helpful in understanding the present invention. The memory device includes an array of memory cells 730. The memory array 730 is arranged in banks of rows and columns.

An address buffer circuit 740 is provided to latch address signals provided on address input connections AO-Ax 742. Address signals are received and decoded by row decoder 744 and a column decoder 746 to access the memory array 730. It will be appreciated by those skilled in the art, with the benefit of the present description, that the number of address input connections depends upon the density and architecture of the memory array. That is, the number of addresses increases with both increased memory cell counts and increased bank and block counts.

The memory device reads data in the array 730 by sensing voltage or current changes in the memory array columns using sense/latch circuitry 750. The sense/latch circuitry, in one embodiment, is coupled to read and latch a row of data from the memory array. Sense/latch circuitry 750 in one embodiment includes a driver circuit for the pass transistors of the sense/latch circuitry, such as that described above. Data input and output buffer circuitry 760 is included for bidirectional data communication over a plurality of data (DQ) connections 762 with the processor 710.

Command control circuit 770 decodes signals provided on control connections 772 from the processor 710. These signals are used to control the operations on the memory array 730, including data read, data write, and erase operations. The flash memory device has been simplified to facilitate a basic understanding of the features of the memory. A more detailed understanding of internal circuitry and functions of flash memories are known to those skilled in the art.

A voltage level translator circuit 780, such as is shown in circuits 300, 400, 500, or 600 above, is shown in FIG. 7 connected to address circuitry 740 and I/O circuitry 750. The voltage level translator circuit 300 is used in various embodiments in a memory device and in a processing system including processor 710, to provide proper voltage translation to circuits having different voltage requirements. It should be understood that any circuit in such a memory device or processing system that needs a voltage different than the supply voltage, for example a boosted voltage, may use the embodiments of the present invention, and that while not all connections are shown, such connections and use of the voltage level translator circuit embodiments of the present invention are within its scope. It should also be understood that while a generic memory device is shown, the voltage level translator circuit embodiments of the present invention are amenable to use with multiple different types of memory devices, including but not limited to dynamic random access memory (DRAM), synchronous DRAM, flash memory, and the like.

It should also be understood that while specific levels of voltages are discussed herein, the embodiments of the present invention are amenable to use with other voltage levels, and the concepts for those other voltage levels are within the scope of the present invention.

CONCLUSION

Level translator circuits have been described that include boosting capacitance and precharge elements to affect the gate to source voltages of transistors to provide operation with smaller NMOS transistors and over a wider Vcc voltage range. NMOS transistor gates for pulling down a drain node is controlled by the boosting technique.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed:

1. A voltage level translator, comprising:
   a pair of cross coupled p-type transistors;
   a pair of n-type transistors connectable between complementary inputs and a gate of the one of the p-type transistors; and
   a pair of boosting circuits, the gate of the n-type transistors connected to one of the boosting circuits, each boosting circuit comprising:
      a first capacitance transistor, drain to source connected, and gate coupled to the gate of its respective n-type transistor; and
      a second capacitance transistor gate connected to the drain of the first capacitance transistor, and connected drain to source between ground and the gate of one of the cross-coupled p-type transistors.

2. The voltage level translator of claim 1, and further comprising:
   a precharge element to precharge the gate of each of the pair of n-type transistors.

3. The voltage level translator of claim 2, wherein each precharge element comprises:
   a thin oxide n-type transistor gate to drain connected between a supply voltage and the gate of one of the first or the second n-type transistors.

4. The voltage level translator of claim 3, wherein each precharge element comprises:
   a thin oxide n-type transistor drain to source connected between a supply voltage and the gate of one of the first or the second n-type transistors, and gate connected to its respective complementary input.

5. A voltage level translator, comprising:
   a pair of cross coupled p-type transistors;
   a pair of n-type transistors connectable between complementary inputs and a gate of the one of the p-type transistors;
   a pair of boosting circuits each to boost a gate voltage of the gate of its respective n-type transistor, and
   a precharge element to precharge the gate of each of the pair of n-type transistors, wherein each boosting circuit comprises:
      a first capacitance transistor, drain to source connected, and gate coupled to the gate of its n-type transistor; and
      a second capacitance transistor gate connected to the drain of the first capacitance transistor, and connected drain to source between ground and the gate of one of the cross-coupled p-type transistors.

6. The voltage level translator of claim 5, wherein each precharge element comprises:
a thin oxide n-type transistor drain to source connected between a supply voltage and the gate of one of the first or the second n-type transistors, and gate connected to its respective complementary input.

7. A voltage level translator, comprising:
a first and a second p-type transistor;
a first and a second n-type transistor, the first n-type transistor connected between an input signal and a gate of the second p-type transistor, and the second n-type transistor connected between an input signal and the gate of the first p-type transistor; and
a pair of boosting circuits, the gate of one of the n-type transistors connected to one of the boosting circuits to boost the gate voltage of the n-type transistor, wherein each boosting circuit comprises a capacitance element comprising:
a first capacitance transistor, drain to source connected, and gate coupled to the gate of its n-type transistor; and
a second capacitance transistor gate connected to the drain of the first capacitance transistor, and connected drain to source between ground and the gate of one of the cross-coupled p-type transistors.

8. The voltage level translator of claim 7, and further comprising:
a precharge element to precharge the gate of each of the pair of n-type transistors.

9. The voltage level translator of claim 8, wherein each precharge element comprises:
a thin oxide n-type transistor gate to drain connected between a supply voltage and the gate of one of the first or the second n-type transistors.

10. The voltage level translator of claim 8, wherein each precharge element comprises:
a thin oxide n-type transistor gate to drain connected between a supply voltage and the gate of one of the first or the second n-type transistors.

11. A voltage level translator, comprising:
a pair of cross coupled p-type transistors;
a pair of n-type transistors connected between complementary inputs and a gate of the one of the p-type transistors;
a pair of boosting circuits, the gate of the n-type transistors connected to one of the boosting circuits to boost the gate voltage of the n-type transistor; and
a precharge element to precharge the precharge the gate of each of the pair transistors, wherein each boosting circuit comprises a capacitance element comprising:
a first capacitance transistor, drain to source connected, and gate coupled to the gate of its n-type transistor; and
a second capacitance transistor gate connected to the drain of the first capacitance transistor, and connected drain to source between ground and the gate of one of the cross-coupled p-type transistors.

12. The voltage level translator of claim 11, wherein each precharge element comprises:
a thin oxide n-type transistor gate to drain connected between a supply voltage and the gate of one of the first or the second n-type transistors.

13. A memory device comprising:
an array of memory cells;
control circuitry to read, write and erase the memory cells;
address circuitry to latch address signals provided on address input connections;
input/output circuitry coupled to read and latch a row of data from the memory array; and
a voltage level translator circuit connected to at least one of the control circuitry, the address circuitry, or the input/output circuitry, the voltage level translator comprising:
a pair of cross coupled p-type transistors;
a pair of n-type transistors connected between complementary inputs and a gate of the one of the p-type transistors; and
a pair of boosting circuits, the gate of the n-type transistors connected to one of the boosting circuits, each boosting circuit comprising:
a first capacitance transistor, drain to source connected, and gate coupled to the gate of its n-type transistor; and
a second capacitance transistor gate connected to the drain of the first capacitance transistor, and connected drain to source between ground and the gate of one of the cross-coupled p-type transistors.

14. A processing system, comprising:
a processor; and
a memory coupled to the processor to store data provided by the processor and to provide data to the processor, the memory comprising:
an array of memory cells;
control circuitry to read, write and erase the memory cells;
address circuitry to latch address signals provided on address input connections;
input/output circuitry coupled to read and latch a row of data from the memory array; and
a voltage level translator circuit connected to at least one of the control circuitry, the address circuitry, or the input/output circuitry, the voltage level translator comprising:
a pair of cross coupled p-type transistors;
a pair of n-type transistors connected between complementary inputs and a gate of the one of the p-type transistors; and
a pair of boosting circuits, the gate of the n-type transistors connected to one of the boosting circuits, each boosting circuit comprising:
a first capacitance transistor, drain to source connected, and gate coupled to the gate of its n-type transistor; and
a second capacitance transistor gate connected to the drain of the first capacitance transistor, and connected drain to source between ground and the gate of one of the cross-coupled p-type transistors.

15. A method of boosting gate to source voltage of an n-type transistor in a voltage level translator, comprising:
boosting a gate to source voltage of each of a pair of pull down n-type transistors in the translator, wherein boosting comprises boosting with a first drain to source connected transistor having its gate coupled to the gate of its respective n-type transistor and a second capacitance transistor gate connected to the drain of the first capacitance transistor and drain to source connected between ground and the gate of one of the cross-coupled p-type transistors.

16. The method of claim 15, wherein boosting further comprises:
boosting capacitance of a boosting element connected to the gate of the n-type transistor.

17. The method of claim 15, and further comprising:
clamping a clamping transistor to which the boosting capacitance is also connected.

18. The method of claim 17, wherein clamping comprises:
limiting a voltage at the gate of each n-type transistor to approximately the supply voltage plus a threshold voltage of the clamping transistor.

19. The method of claim 15, and further comprising:
precharging a node connected to the gate of each of the pull down n-type transistors.

20. The method of claim 19, and further comprising:
limiting the voltages at the nodes between the boosting capacitance and the precharge elements.

21. The method of claim 20, wherein limiting is performed with a clamping circuit.

22. The method of claim 15, and further comprising:
precharging the gate of each of the pair of pull down n-type transistors.

23. A method of translating voltage level, comprising:
boosting a gate voltage of the gate of each of a pair of n-type transistors in a level translator, and
precharging the gate of each of the pair of n-type transistors;
wherein boosting comprises boosting with a first drain to source connected transistor having its gate coupled to the gate of its respective n-type transistor and a second capacitance transistor gate connected to the drain of the first capacitance transistor and drain to source connected between ground and the gate of one of the cross-coupled p-type transistors.

24. The method of claim 23, wherein boosting further comprises:
boosting capacitance of a boosting element connected to the gate of the n-type transistor.

25. The method of claim 23, and further comprising:
clamping a clamping transistor, a single clamping transistor connected to each of the n-type transistor gates.

26. The method of claim 25, wherein clamping comprises:
limiting a voltage at the gate of each n-type transistor to approximately the supply voltage plus a threshold voltage of the clamping transistor.

27. The method of claim 23, and further comprising:
limiting the voltages at the nodes between the boosting capacitance and the precharge elements.

28. The method of claim 27, wherein limiting is performed with a clamping circuit.

29. The method of claim 23, wherein precharging comprises:
providing a precharge voltage to the gate of each of the n-type transistors through a gate to source connected thin oxide transistor, the precharge voltage being approximately the supply voltage minus a threshold voltage of the thin oxide transistor.

30. The method of claim 23, and further comprising:
blocking early latching of the level translator.

31. The method of claim 30, wherein blocking comprises:
providing a precharge voltage to the gate of each of the n-type transistors through a gate to source connected thin oxide transistor, the precharge voltage being approximately the supply voltage minus a threshold voltage of the thin oxide transistor.

32. A method of increasing an operating range of supply voltage in a voltage level translator, comprising:
boosting a gate to source voltage of each of a pair of pull down n-type transistors in the translator; and
precharging the gate of each of the pair of n-type transistors;
wherein boosting comprises boosting with a first drain to source connected transistor having its gate coupled to the gate of its respective n-type transistor and a second capacitance transistor gate connected to the drain of the first capacitance transistor and drain to source connected between ground and the gate of one of the cross-coupled p-type transistors.

33. The method of claim 32, wherein boosting further comprises:
boosting capacitance of a boosting element connected to the gate of the n-type transistor.

34. The method of claim 32, and further comprising:
clamping a clamping transistor, a single clamping transistor connected to each of the n-type transistor gates.

35. The method of claim 34, wherein clamping comprises:
limiting a voltage at the gate of each n-type transistor to approximately the supply voltage plus a threshold voltage of the clamping transistor.

36. The method of claim 32, and further comprising:
limiting the voltages at the nodes between the boosting capacitance and the precharge elements.

37. The method of claim 36, wherein limiting is performed with a clamping circuit.

38. The method of claim 32, wherein precharging comprises:
providing a precharge voltage to the gate of each of the n-type transistors through a gate to source connected thin oxide transistor, the precharge voltage being approximately the supply voltage minus a threshold voltage of the thin oxide transistor.

39. The method of claim 32, and further comprising:
blocking early latching of the level translator.

40. The method of claim 39, wherein blocking comprises:
providing a precharge voltage to the gate of each of the n-type transistors through a gate to source connected thin oxide transistor, the precharge voltage being approximately the supply voltage minus a threshold voltage of the thin oxide transistor.

41. A method of expanding an operating voltage range of a level translator circuit, comprising:
boosting a gate voltage of the gate of each of a pair of n-type transistors, and precharging the gate of each of the pair of n-type transistors, wherein boosting comprises boosting with a first drain to source connected transistor having its gate coupled to the gate of its respective n-type transistor and a second capacitance transistor gate connected to the drain of the first capacitance transistor and drain to source connected between ground and the gate of one of the cross-coupled p-type transistors.

* * * * *

UNITED STATES PATENT AND TRADEMARK OFFICE
CERTIFICATE OF CORRECTION

PATENT NO. : 7,200,053 B2
APPLICATION NO. : 10/931587
DATED : April 3, 2007
INVENTOR(S) : Tae H. Kim, Michael V. Cordoba and Howard C. Kirsch It is certified that error appears in the above-identified patent and that said Letters Patent is hereby corrected as shown below:

The sheet of drawings consisting of figure 5 should be deleted to appear as per attached figure 5.
Column 4, line 26, replace "transistor 322 connected" with --transistor 316 connected--.
Column 4, lines 60 to 61, replace "at the nodes 502 and 504" with --at the nodes 304 and 310--.
Column 5, line 47, replace "and I/O circuitry 750" with --and I/O circuitry 760--.
Column 6, line 45, replace "of claim 3" with --of claim 2--.
Column 7, lines 35 through 39, cancel claim 10 as it is an exact duplicate of claim 9.

Signed and Sealed this

Thirtieth Day of June, 2009

JOHN DOLL
*Acting Director of the United States Patent and Trademark Office*